United States Patent [19]

Nonaka

[11] 4,209,795
[45] Jun. 24, 1980

[54] JSIT-TYPE FIELD EFFECT TRANSISTOR WITH DEEP LEVEL CHANNEL DOPING

[75] Inventor: Terumoto Nonaka, Hamamatsu, Japan

[73] Assignee: Nippon Gakki Seizo Kabushiki Kaisha, Hamamatsu, Japan

[21] Appl. No.: 854,040

[22] Filed: Nov. 22, 1977

[30] Foreign Application Priority Data

Dec. 6, 1976 [JP] Japan ............................. 51-146251

[51] Int. Cl.² ............................................. H01L 29/80
[52] U.S. Cl. ........................................ 357/22; 357/21; 357/43; 357/64; 357/92
[58] Field of Search ........................ 357/21, 22, 64, 43, 357/92

[56] References Cited

U.S. PATENT DOCUMENTS

| | | | |
|---|---|---|---|
| 2,754,456 | 7/1956 | Madelung | 357/21 |
| 2,778,956 | 1/1957 | Dacey et al. | 357/22 |
| 2,975,344 | 3/1961 | Wegener | 357/22 |
| 3,056,100 | 9/1962 | Warner | 357/22 |
| 3,184,347 | 5/1965 | Hoerni | 357/22 |
| 3,274,463 | 9/1966 | Hutson | 357/21 |

FOREIGN PATENT DOCUMENTS

| | | | |
|---|---|---|---|
| 983252 | 2/1965 | United Kingdom | 357/43 |
| 1390034 | 4/1975 | United Kingdom | 357/43 |

OTHER PUBLICATIONS

"Junction Field-Effect Transistor Designed for Speedy Logic," Electronics, Aug. 19, 1976, vol. 49, #7, International Edition, pp. 4E, 6E.

J. Porter, "JFET-Transistor Yields Device with Negative Resistance," IEEE Trans. on Elec. Dev., Sep. 1976, pp. 1098-1099.

*Primary Examiner*—Joseph E. Clawson, Jr.
*Attorney, Agent, or Firm*—Cushman, Darby & Cushman

[57] ABSTRACT

A field effect transistor of the type wherein the conductivity of the channel thereof is variable by injecting the minority carriers into the channel from the gate thereof, is disclosed. The channel of the transistor includes minority carrier recombination centers in such an amount that the lifetime of the minority carriers in the channel may be shortened so as to sufficiently reduce the minority carrier storage effect in the channel. The recombination centers may comprise elements such as gold doped in the channel region. This field effect transistor is hardly subject to the minority carrier storage effect and is capable of effecting a turn-off action at a markedly high speed.

17 Claims, 3 Drawing Figures

JSIT-TYPE FIELD EFFECT TRANSISTOR WITH DEEP LEVEL CHANNEL DOPING

BACKGROUND OF THE INVENTION (a) Field of the invention:

The present invention is related to a transistor, and in particular it pertains to a field effect transistor of the type wherein the channel is conductivity-modulated in accordance with the amount of minority carriers injected from the gate into the channel of the field effect transistor.

(b) Description of the prior art:

Field effect transistors of the type wherein the impedance between the source and the drain is controlled according to the amount of minority carriers injected from the gate into the channel located between the source and the drain have been proposed. As an example of the field effect transistors of the type described above, a junction field effect transistor of vertical type has been proposed by Jun-ichi Nishizawa. This junction field effect transistor is designed so that depletion layers extending from the gate into the channel may substantially pinch-off the channel when the gate p-n junction is zero-biased, and that the depletion layers may shrink to render the channel conductive when the gate p-n junction is forwardly biased, i.e. when sufficient amount of minority carriers are injected from the gate into the channel.

The aforementioned junction field effect transistor has many excellent features, and finds wide use in its electronic applications. However, this junction field effect transistor is accompanied by the drawback that the switching speed, particularly the turn-off speed thereof is inherently somewhat limited due to the minority carrier storage effect at the gate p-n junction.

SUMMARY OF THE INVENTION

It is, therefore, an object of the present invention to provide a field effect transistor of the type wherein the channel is conductivity-modulated according to whether or not minority carriers are injected from the gate into the channel, and which is capable of making rapid turning on and off actions.

Another object of the present invention is to provide a junction field effect transistor of the type described above, which is substantially free from the minority carrier storage effect at the gate p-n junction.

Yet another object of the present invention is to provide a junction field effect transistor of the type described above, which is suitable for use as a switching element in a logic circuit.

A further object of the present invention is to provide an integrated injection logic (IIL) circuit employing a junction field effect transistor as the driver or inverter transistor thereof.

A feature of the present invention resides in that the life time of the injected minority carriers in the channel is shortened by the inclusion of a sufficient amount of recombination centers for the injected minority carriers in the channel region. The recombination centers may, for instance, comprise lattice defects formed in the channel region lattices by the application of high-energized rays onto the channel region. Alternatively, the recombination centers may comprise substitutional impurities, i.e. one or more life time killer elements, such as gold, iron, copper or other heavy metallic elements, introduced in the lattices of the channel region.

It should be understood that the presence of such lattice defect in the channel region does not adversely affect the essential characteristics of the field effect transistor, because the field effect transistor inherently operates on the basis of majority carrier behavior.

These and other objects as well as the features and the advantages of the present invention will become apparent by reading the following detailed description of the preferred embodiment when taken in conjunction with the accompanying drawings.

BRIEF DESCRIPTION OF THE DRAWINGS

Like portions are indicated by like reference numerals and symbols throughout the drawings.

DETAILED DESCRIPTION OF THE PREFERRED EMBODIMENT

Figures 1, 2:
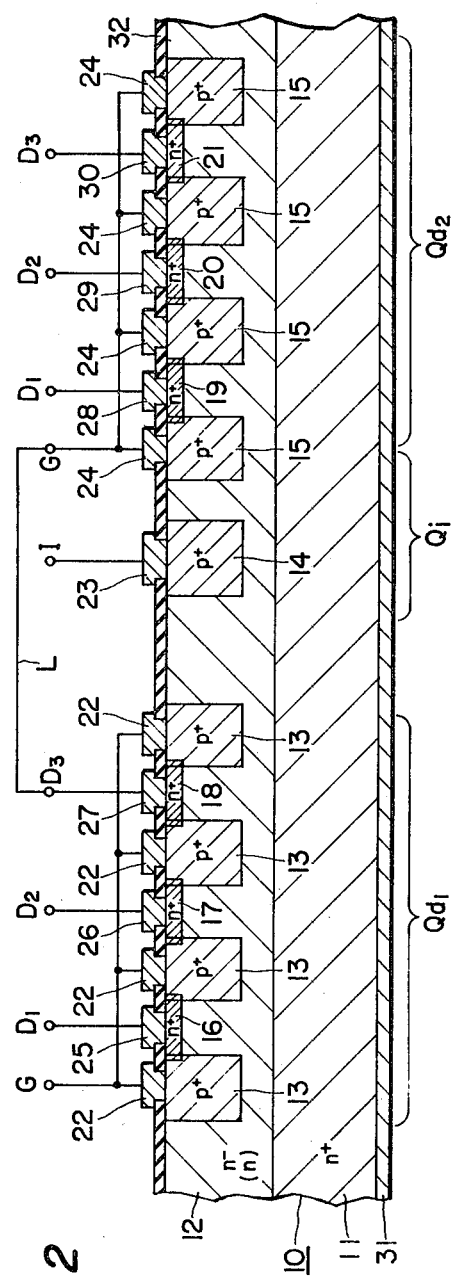
FIG. 1 is a diagrammatic top plan view of an example of the IIL circuit device employing junction field effect transistors according to the present invention as the driver or inverter transistors thereof.
FIG. 2 is a sectional view taken substantially along the line A—A of the device of FIG. 1.

An example of IIL Circuit device employing junction field effect transistors embodying the present invention (hereinafter referred to as SITL which is an abbreviation of a Static Induction Transistor Logic) is illustrated in top plan view in FIG. 1, and in section in FIG. 2.

The SITL circuit device includes an N-type semiconductor substrate 10 of a low resistivity, which may be a mono-crystalline or poly-crystalline silicon. On the top surface of the substrate 11 is deposited an N-type semiconductor layer 12 of a relatively high resistivity as compared with that of the substrate 11, to constitute a monolithic semiconductor wafer 10 together with the semiconductor layer 12. The layer 12 may be formed by relying on the conventional vapor deposition technique or diffusion technique. In the semiconductor layer 12, individual highly-doped P-type semiconductor regions 13, 14 and 15 extending from the top surface of the layer 12 to the inside thereof are formed, by the selective diffusion technique, for instance. The respective regions 13, 14 and 15 have a low resistivity. On the upper surfaces of the regions 13 is deposited a continuous electrode 22, establishing ohmic contacts with these surfaces. Also, on the upper surface of the region 14 is deposited an ohmic-contacting electrode 23. Another continuous electrode 24 is deposited on the upper surfaces of the regions 15. Those electrodes 22, 23 and 24 may be deposited by relying on the masking or evaporation techniques. Alternatively, the electrodes may be deposited by a paste containing metallic particles which may be painted or silk-screened on the desired portions. On the upper surfaces of those portions of the layer 12 which are located between the semiconductor regions 13, discrete electrodes 25, 26 and 27 are deposited, respectively. Furthermore, on the upper surfaces of those portions of the layer 12 which are located between the respective regions 15, individual electrodes 28, 29 and 30 are deposited, respectively. These electrodes 25, 26, 27, 28, 29 and 30 are adapted to establish ohmic contacts with respctive highly-doped N-type semiconductor regions 16, 17, 18, 19, 20 and 21 of a low resistivity provided at the upper parts of the portions of the layer 12 sandwiched between the adjacent regions 13 and 15. These low-resistivity regions may be formed by relying on the selective diffusion techniques, for example. On the bottom surface of the substrate 11, an ohmic-contacting electrode 31 is provided. Reference numeral 32 indicates a passivation film of insulating material such as silicon dioxide, which covers the exposed portions of the upper surface of the layer 12.

In the embodiment of FIG. 2, the N-type semiconductor layer 11 has a impurity concentration of $10^{24}$–$10^{27}$ atoms/m$^3$. The other N-type layer 12 has an impurity concentration of $10^{18}$–$10^{21}$ atoms/m$^3$ and a depth of 2–10 μm. Each of the P-type regions 13, 14 and 15 has an impurity concentration of $10^{24}$–$10^{26}$ atoms/m$^3$ and a depth of 1–3 μm. Each of the N-type regions 16 through 21 has an impurity concentration of $10^{24}$–$10^{27}$ atoms/m$^3$ and a depth of 1 μm or less. The portion of the layer 12 sandwiched between the regions 14 and 15 has a thickness of 5 μm or less in the horizontal direction viewed in FIG. 2. Each adjacent pair of the regions 13 and 15 are separated by a distance of 2–10 μm which is occupied by a portion of the layer 12 of the impurity concentration of $10^{18}$–$10^{21}$ atoms/m$^3$.

The equivalent circuit of the embodiment described above is illustrated in FIG. 3, wherein reference symbol $Q_i$ represents an injector transistor of bipolar type, and symbols $Q_{d1}$ and $Q_{d2}$ represent driver or inverter transistors each comprising a junction field effect transistor of vertical type embodying the present invention.

Figure 3:
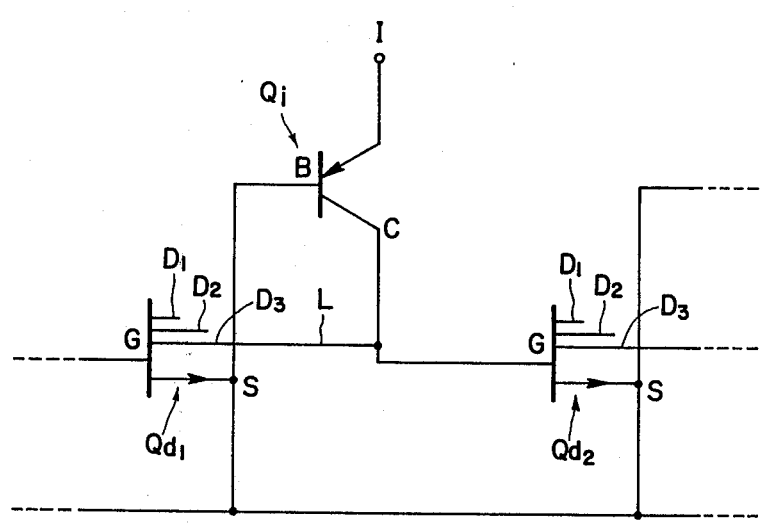
FIG. 3 is an equivalent circuit diagram of the device shown in FIGS. 1 and 2.

Description will now be made on the co-relationship between FIG. 3 and FIG. 2. The driver transistor $Q_{d1}$ comprises the semiconductor layer 12, and the semiconductor regions 13, 16, 17 and 18. More particularly, the p-type semiconductor regions 13, the substrate 11 and the n-type semiconductor layer portions 12 located adjacent to the upper portion of the substrate 11, the portions of the n-type semiconductor layer 12 sandwiched between the adjacent pair of the regions 13, and the n-type regions 16, 17 and 18 including those portions of the layer 12 which are located adjacent to the regions 16, 17 and 18, constitute the gates G, the sources S, the channels and the drains $D_1$, $D_2$ and $D_3$ of the N-channel junction field effect transistor $Q_{d1}$ of the vertical type, respectively. Similarly, the p-type semiconductor regions 15, the substrate 11 and the n-type semiconductor layer portions 12 located near the upper surface of the substrate 11, the portions of the layer 12 sandwiched between the adjacent pair of the regions 15, and the n-type regions 19, 20 and 21 including those portions of the layer 12 which are located adjacent to these regions constitute the gates G, the sources S, the channels and the drains $D_1$, $D_2$ and $D_3$ of the driver transistor $Q_{d2}$ which is an N-channel junction field effect transistor of vertical type, respectively. On the other hand, the p-type semiconductor region 14, one of the regions 15 which is located nearest to the region 14, and that portion of the n-type semiconductor layer 12 which is sandwiched between these regions constitute the emitter I, the collector C, and the base B of the injector transistor $Q_i$ of bipolar type, respectively.

As shown in FIG. 1, the respective gates of the driver transistor $Q_{d1}$ are connected together by the continuous electrode 22, i.e. held at a same potential. Similarly thereto, the respective gates of the driver transistor $Q_{d2}$ are connected together by the continuous electrode 24, i.e. maintained at a same potential. The collector of the injector transistor $Q_i$ or the gate G of the driver transistor $Q_{d2}$ is coupled to the drain $D_3$ of the driver transistor $Q_{d1}$ by a conductive line L. Moreover, the sources of both of the driver transistors $Q_{d1}$ and $Q_{d2}$ are connected together by the continuous electrode 31 at the bottom side of the substrate 11, as illustrated in FIG. 2.

Each of the driver transistors $Q_{d1}$ and $Q_{d2}$ is designed to operate so that the channels are substantially pinched off by the depletion layers growing from the gates into the channels when the gate p-n junctions are nearly zero-biased, and that the depletion layers shrink to render the channels conductive when the gate potential is raised to about the built-in barrier voltage of 0.3–0.6 volt of the gate p-n junctions. In other words, the dimensions and the carrier concentrations of the respective regions are determined so as to satisfy the aforementioned requirements. Needless to say, the above-mentioned channels of the driver transistor $Q_{d1}$ (or $Q_{d2}$) are those portions of the semiconductor layer which are surrounded by the gates 13 (or 15), the drains 16, 17 and 18 (or 19, 20 and 21) and the continuous source.

Furthermore, in accordance with the present invention, the channels of the driver transistors $Q_{d1}$ and $Q_{d2}$ include recombination centers for the minority carriers injected thereinto from the gates to such an amount that the life time of the injected minority carriers is sufficiently shortened in order to reduce the minority carrier storage effect, so that the increased switching speed, particularly the turning-off speed, of the transistors $Q_{d1}$ and $Q_{d2}$ is attained. Such recombination centers may comprise the lattice defects in the channel regions. The lattice defects may be formed, for instance, either by doping any suitable substitutional impurities, i.e. so-called life time killer elements such as gold, iron, copper or other heavy metallic elements, into the channels, or by applying any high-energy rays, such as electron rays, to the channel.

In this embodiment, an element such as gold as the substitutional impurity, is doped in the entire range of the semiconductor layer 12 including the channels, and the concentration of this element gold is selected in the range of about $10^{18}$–$10^{21}$ atoms/m$^3$. It should be noted that it is sufficient that only in the channel regions is selectively doped the element gold. In the arrangement of this embodiment, however, there can be obtained the advantage that the doping of the element gold is performed simultaneously with the formation of the semiconductor layer 11. The doped gold provides such recombination centers at energy levels which are relatively low as compared with those of the conduction energy bands in the channel region crystal. Excessive minority carriers and the majority carriers in the channels are trapped by the energy levels of the doped gold in the channels, and the they are recombined with each other, with the result represented by a reduced life time of the minority carriers. As a result, the driver transistors $Q_{d1}$ and $Q_{d2}$ embodying the present invention are hardly subject to the minority carrier storage effect, and thus can effect a rapid turn-off.

The operation of the aforementioned embodiment of the present invention is explained hereunder with reference to the respective Figures.

Let us now suppose that the injector transistor $Q_i$ is in the non-conducting state, and also the driver transistor $Q_{d1}$ is turned off. In this condition, the subsequent stage driver transistor $Q_{d2}$ is in its "off" state, because the gate depletion layers are pinching off the channels. When the injector transistor $Q_i$ is forward-biased with a positive voltage applied to the emitter electrode 23, i.e. the injection electrode I, holes are injected into the gates of the driver transistor $Q_{d2}$ from the injector transistor $Q_i$ to raise the potential of the gate of the transistor $Q_{d2}$ to a level at about the built-in barrier voltage of the gate p-n junctions. As a result, a sufficient amount of holes are injected from the gates into the channels of the transistor $Q_{d2}$ so that the gate p-n junctions are forward biased. Accordingly, the gate depletion layers will shrink to render the channels conductive, with the result that the driver transistor $Q_{d2}$ is turned on.

Thereafter, if a positive voltage of approximately the gate built-in voltage is applied to the gate electrode 22 of the transistor $Q_{d1}$ to forward-bias transistor $Q_{d1}$, the holes from the injector transistor $Q_i$ are drawn into the conducting driver transistor $Q_{d1}$ via the connecting line L. As a result, the gate potential of the driver transistor $Q_{d2}$ is pulled down to a substantially low level at which the driver transistor $Q_{d2}$ is turned off. As described previously, the channels of the transistor $Q_{d2}$ include minority carrier recombination centers, and the life time of the minority carriers, i.e. holes in the channel regions, is considerably shortened. Therefore, the excessive holes in the channel regions will rapidly disappear due to these recombinations, so that the turning-off of the transistor is accomplished at a high speed.

It should be understood that the driver transistor ($Q_{d1}$, $Q_{d2}$) has such a drain-to-source resistance in the conducting state thereof that it is effective for pulling down the potential of the gates of the connected driver transistor to a low level at which the latter driver transistor is turned off.

It will be understood by those skilled in the art, that changes and modifications may be made to the aforementioned embodiment of the present invention without departing from the spirit and scope of the invention as set forth in the claims appended hereto. Furthermore, the present invention can be applied to any junction field effect transistor of the type which exhibits operation characteristics resembling those of pentode vacuum tubes, as well as to a junction field effect transistor of the vertical type like the afore-mentioned embodiment transistors which exhibits operation characteristics resembling those of triode vacuum tubes.

What is claimed is:

1. In a semiconductor device of the type which comprises:
   a source semiconductor region having a first conductivity type;
   a drain semiconductor region having said first conductivity type;
   a channel semiconductor region having said first conductivity type for providing a current path between said source and said drain; and
   a gate semiconductor region having a second conductivity type opposite to said first conductivity type and adjoining said channel to form a p-n junction with said channel;
   said channel being substantially pinched-off by a depletion layer developed around said p-n junction without application of an external biasing potential to said gate;
   said channel being rendered conductive by application of an external biasing potential to said gate to forward-bias said p-n junction, causing said depletion layer to shrink, the improvement comprising:
   recombination centers for minority carriers in said channel, formed in at least said channel, thereby reducing storage effect due to those minority carriers which are injected into said channel from said gate in the conductive state of said channel.

2. In a device according to claim 1, in which said recombination centers comprise a heavy metallic element doped in said channel, said heavy metallic element being one of the group consisting of gold, iron and copper.

3. In a device according to claim 2, in which said heavy metallic element is gold, wherein said first conductivity type is N-type and second conductivity type is P-type.

4. In a device according to claim 1, in which said channel, drain, gate and source semiconductor regions, respectively, are semiconductor regions formed in a single common semiconductor wafer, and in which the entire semiconductor wafer includes said recombination centers.

5. In a device according to claim 4, in which said recombination centers comprise a heavy metallic element doped in said semiconductor wafer, said heavy metallic element being one of the group consisting of gold, iron and copper.

6. In a device according to claim 4, in which said recombination centers comprise gold doped in said semiconductor wafer, and wherein said first conductivity type is N-type and said second conductivity type is P-type.

7. An integrated semiconductor device including at least one unit comprising a bipolar injector transistor and a junction field effect driver transistor, the two transistors being formed in a single common monolithic semiconductor wafer;
   said driver transistor comprising:
   a drain semiconductor region having a first conductivity type;
   a source semiconductor region having said first conductivity type;
   a channel semiconductor region located between said source region and said drain region and having said first conductivity type; and
   a gate semiconductor region having a second conductivity type opposite to said first conductivity type, said gate region being provided adjacent to said channel region to make, jointly with said channel region, a p-n junction defining a boundary of said channel region and providing a depletion layer growing from said gate region into said channel region;
   said depletion layer growing enough to substantially pinch-off said channel region with said p-n junction being other than forward-biased;
   said injector transistor comprising:
   an emitter semiconductor region having said second conductivity type and provided adjacent to, but separated from, said gate region of said driver transistor;
   a collector semiconductor region having said second conductivity type and merged into said gate region of said driver transistor; and
   a base semiconductor region having said first conductivity type and sandwiched between said emitter region and said gate region;
   said emitter region being responsive to a biasing potential applied thereto to inject charge carriers through said base region into said gate region so as to forward-bias said p-n junction, thereby causing said depletion layer to shrink and rendering said channel region conductive; and means for reducing storage effect due to the minority carriers which are injected into said channel region from said gate region in the conductive state of said channel region, said means comprising recombination centers for minority carriers formed in said channel region.

8. An integrated semiconductor device according to claim 7 in which said recombination centers in said channel region comprise a heavy metallic element doped in said channel region, said heavy metallic element being one of the group consisting of gold, iron and copper.

9. An integrated semiconductor device according to claim 8 in which said heavy metallic element is gold and wherein said first conductivity type is N-type, and said second conductivity type is P-type.

10. An integrated semiconductor device according to claim 8 in which said heavy metallic element is doped in the entire region of said wafer.

11. In a semiconductor device of the type including source, drain, gate and channel semiconductor regions, said source, drain and channel regions being of a first conductivity type and said gate region being of a second conductivity type opposite to said first conductivity type, said source, drain and gate regions being relatively disposed to define a controlled current path between said source and drain regions through said channel region, said gate and channel regions forming a p-n junction therebetween, said p-n junction generating a depletion layer extending across said channel to at least nearly pinch-off said current path through said channel region in the absence of an externally applied forward-bias across said junction, the improvement wherein:
said device includes means for reducing storage effect due to minority carriers injected into said channel region from said gate region in the conductive state of said channel region, said means comprising recombination centers for minority carriers formed in said channel.

12. In a device according to claim 11, in which said recombination centers comprise a heavy metallic element doped in said channel, said heavy metallic element being one of the group consisting of gold, iron and copper.

13. In a device according to claim 12, in which said heavy metallic element is gold, wherein said first conductivity type is N-type and second conductivity type is P-type.

14. In a device according to claim 11, in which said channel, drain, gate and source semiconductor regions, respectively, are semiconductor regions formed in a single common semiconductor wafer, and in which the entire semiconductor wafer includes said recombination centers.

15. In a device according to claim 14, in which said recombination centers comprise gold doped in said semiconductor wafer, and wherein said first conductivity type is N-type and said second conductivity type is P-type.

16. In a semiconductor device of the type including source, drain, gate and channel semiconductor regions, said source, drain and channel regions being of a first conductivity type opposite to said first conductivity type, said source, drain and gate regions being relatively disposed to define a controlled current path between said source and drain regions through said channel region, said gate and channel region forming a p-n junction therebetween, said p-n junction generating a depletion layer extending across said channel to at least nearly pinch-off said current path through said channel region in the absence of an externally applied forward-bias across said junction, a method for reducing storage effect due to minority carriers injected into said channel, comprising the step of forming recombination centers for minority carriers in at least said channel semiconductor region.

17. The method of claim 16 wherein said forming step comprises doping said channel region with a heavy metallic element taken from the group consisting of gold, iron and copper.

* * * * *